United States Patent
Jeon et al.

(10) Patent No.: US 8,811,081 B2
(45) Date of Patent: Aug. 19, 2014

(54) SYSTEMS AND METHODS OF UPDATING READ VOLTAGES IN A MEMORY

(75) Inventors: Seungjune Jeon, Milpitas, CA (US); Jonathan Hsu, Milpitas, CA (US)

(73) Assignee: Sandisk Technologies Inc., Plano, TX (US)

( * ) Notice: Subject to any disclaimer, the term of this patent is extended or adjusted under 35 U.S.C. 154(b) by 131 days.

(21) Appl. No.: 13/316,153

(22) Filed: Dec. 9, 2011

(65) Prior Publication Data

US 2013/0151753 A1    Jun. 13, 2013

(51) Int. Cl.
*G11C 5/14* (2006.01)

(52) U.S. Cl.
USPC ............ 365/185.09; 365/185.11; 365/185.12; 365/185.15

(58) Field of Classification Search
CPC ...................................................... G11C 29/82
USPC .............. 365/185.09, 185.12, 185.11, 185.17
See application file for complete search history.

(56) References Cited

U.S. PATENT DOCUMENTS

| | | | |
|---|---|---|---|
| 7,450,432 B2 | 11/2008 | Wang | |
| 2007/0279982 A1 | 12/2007 | Shibata et al. | |
| 2008/0244162 A1 * | 10/2008 | Mokhlesi et al. | 711/103 |
| 2009/0106485 A1 | 4/2009 | Anholt | |
| 2009/0319868 A1 | 12/2009 | Sharon et al. | |
| 2010/0091535 A1 * | 4/2010 | Sommer et al. | 365/45 |
| 2010/0124112 A1 | 5/2010 | Kasuga | |
| 2010/0271874 A1 * | 10/2010 | Mokhlesi et al. | 365/185.02 |

FOREIGN PATENT DOCUMENTS

| | | |
|---|---|---|
| WO | 2008111058 A2 | 9/2008 |
| WO | 2009002940 A2 | 12/2008 |
| WO | 2012075826 A1 | 6/2012 |

OTHER PUBLICATIONS

The International Search Report and Written Opinion mailed Feb. 14, 2013 in International Application No. PCT/US2012/065329, 15 pages.

* cited by examiner

*Primary Examiner* — Son Dinh
*Assistant Examiner* — Uyen B Tran
(74) *Attorney, Agent, or Firm* — Toler Law Group, PC (57) ABSTRACT

A method includes receiving hard bit data and soft bit data corresponding to a portion of a memory, where each storage element of the memory stores multiple bits per storage element. The hard bit data and the soft bit data is received in connection with reading a single bit of the multiple bits from each storage element in the portion of the memory based on one or more first read voltages. One or more second read voltages based on the hard bit data and the soft bit data are generated in response to a read voltage update operation. The memory reads data from the portion of the memory using the one or more second read voltages.

18 Claims, 7 Drawing Sheets

SYSTEMS AND METHODS OF UPDATING READ VOLTAGES IN A MEMORY

FIELD OF THE DISCLOSURE

The present disclosure is generally related to updating read voltages in a memory.

BACKGROUND

Non-volatile memory devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state that corresponds to the sequence of bits.

Once memory cells in the memory device have been programmed, data may be read from the memory cells by sensing the programming state of the memory cells by comparing cell threshold voltages to one or more read thresholds. However, sensed programming states can sometimes vary from the written programming states due to one or more factors, such as data retention and program disturb conditions.

SUMMARY

Improved error correction capability of data stored in a data storage device may be achieved by updating read voltages by reading a single bit from each storage element in a portion of a memory. Each storage element may store multiple bits corresponding to multiple pages that may be individually read. Rather than updating the read thresholds of all pages of the portion of the memory concurrently, it may be beneficial to update only the read thresholds of the page that is being accessed.

DETAILED DESCRIPTION

Improved error correction capability of data stored in a memory of a data storage device may be achieved with reduced latency by updating read voltages by reading a single bit from each storage element in a portion of the memory rather than updating the read thresholds of all pages of the memory concurrently.

Systems and methods of updating read voltages by reading a single bit from each storage element in a portion of a memory are disclosed. Hard bit data and soft bit data corresponding to the portion of the memory (e.g., a block, a word line, or a page) is received by a controller of a data storage device, where each storage element of the memory stores multiple bits per storage element. The hard bit data and the soft bit data are received in connection with reading a single bit from each storage element in the portion of the memory based on one or more first read voltages. One or more second read voltages based on the hard bit data and the soft bit data are generated in response to performing a read voltage update operation. For example, a curve fitting operation may be performed to generate the second read voltages. The memory reads data from the portion of the memory using the one or more second read voltages.

Figure 1:
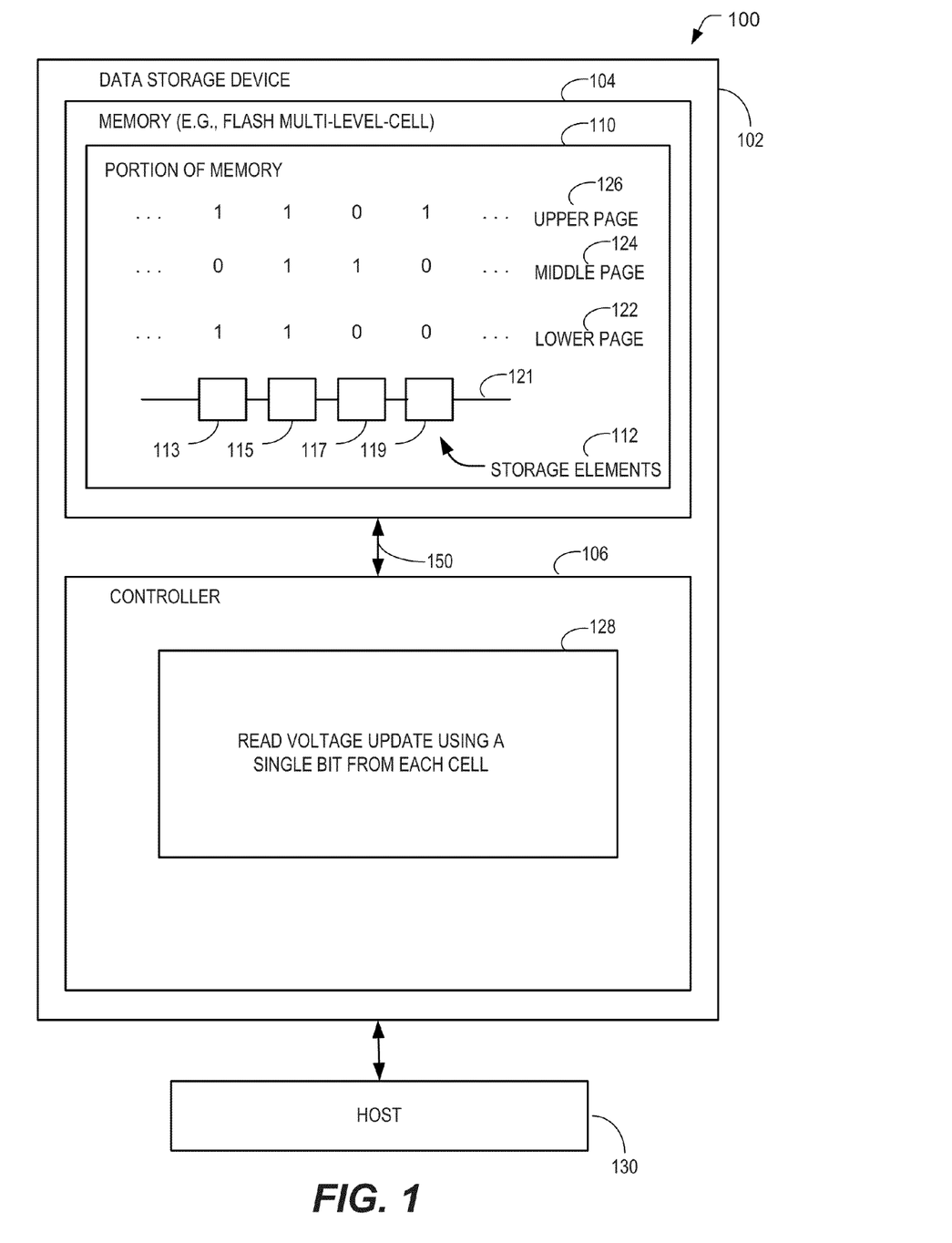
FIG. 1 is a block diagram of a first illustrative embodiment of a system to update read voltages by reading a single bit from each storage element in a portion of a memory.

Referring to FIG. 1, a particular illustrative embodiment of a system of updating read voltages by reading a single bit from each storage element in a portion of a memory is depicted and generally designated 100. The system 100 includes a data storage device 102 coupled to a host device 130. The data storage device 102 includes a memory 104 coupled to a controller 106 via a bus 150.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) memory and eSD memory, as illustrative examples.

The memory 104 may be a nonvolatile memory of a flash device, such as a NAND flash device, a NOR flash device or any other type of flash device. The memory 104 includes a memory portion 110. The memory portion 110 includes a plurality of storage elements, such as memory cells of a multi-level cell (MLC) memory. A group of storage elements 112 may include multiple MLC storage elements, such as representative storage elements 113, 115, 117, 119 of a word line 121 of a flash memory device. Each storage element 113-119 may have a threshold voltage corresponding to a state of the storage element (e.g., a predefined state corresponding to a particular range of threshold voltage values). The state of each storage element 113-119 corresponds to data stored at the storage element 113-119. The data stored at the storage element 113-119 may be read by comparing the threshold voltage to one or more read thresholds.

Each storage element 113-119 may store multiple bits per storage element. For example, data stored at each storage element 113-119 may include a bit of a lower page 122, a bit of a middle page 124, and a bit of an upper page 126. For example, the storage element 113 may include data having a value of "1" stored in the lower page 122, a value of "0" stored in the middle page 124, and a value of "1" stored in the upper page 126. Similarly, the storage element 115 may include data having a value of "1" stored in the lower page 122, a value of "1" stored in the middle page 124, and a value of "1" stored in the upper page 126. To illustrate, the storage elements 113-119 may each be programmed to one of multiple predefined states. Each of the predefined states may be mapped to a particular bit value, such as the "1 0 1" bit value of the storage element 113. The bit value that corresponds to the determined MLC state is referred to as "hard bit(s)". Additional information that can be used to indicate a reliability of the reading of the storage element is referred to as "soft bit(s)".

The controller 106 may be configured to receive memory access requests from the host device 130 and to process data read from the memory 104. The controller 106 may be configured to receive hard bit data and soft bit data corresponding to the portion of the memory 110 from the memory 104. For example, the hard bit data and the soft bit data may correspond to the portion of the memory 110 and may be received by the controller in connection with reading a single bit from each storage element 113-119 in the memory portion 110 based on one or more first read voltages.

The controller 106 is configured to perform a read voltage update operation 128. The read voltage update operation 128 may generate one or more read voltages based on hard bit data and soft bit data received from the memory 104. For example, the read voltage update operation may generate an updated read voltage to be used by the memory 104 in subsequent data reads. Reading data from the memory 104 in a subsequent data read using the updated read voltage may reduce a number of data errors resulting from sensed programming states that do not match written programming states. To illustrate, rather than updating the read thresholds of all pages, it may be beneficial to update only the read thresholds of the page that is being accessed. For example, the controller 106 may be configured to update the read threshold of the upper page 126 of the memory portion 110 rather than updating the read thresholds of the upper, middle, and lower pages 122-126 simultaneously.

To illustrate, an uncorrectable error may occur when reading the upper page 126 stored in one or more of the storage elements (e.g., 113-119) at a first read voltage. Read thresholds are updated in response to the uncorrectable error. Rather than updating the read thresholds of all pages of the flash memory concurrently (e.g., the upper, middle, and lower pages 122-126, respectively), the controller 106 is configured to read a single bit from each storage element (e.g., the bits in the upper page 126) based on the first read voltage. For example, the data of the upper page 126 may be read using the first read voltage (e.g., the data "1 1 0 1" of the upper page 126). Hard bit data and soft bit data may be generated based on the data read at the first read voltage. In response to an occurrence of an uncorrectable error via an error-correction-coding operation, the read voltage update operation 128 may be initiated by the controller 106 to generate a second read voltage based on the hard bit data and the soft bit data received after reading the upper page 126 using the first read voltage. The second read voltage may be generated by a curve fitting operation, as described with respect to FIG. 2.

During operation, the host device 130 may instruct the controller 106 to retrieve data corresponding to one or more of the pages 122-126 stored in the group of storage elements 112. An uncorrectable error may occur when reading data corresponding to one or more of the pages (e.g., pages 122-126) stored in one or more of the storage elements (e.g., 113-119) at a first read voltage. To reduce a number of errors, the controller 106 may determine a second read voltage that may more accurately correspond to a border between cell states that corresponds to the upper page (and that does not correspond to the middle and lower pages). Hard bit data and soft bit data may be generated based on the data read using the first read voltage. The controller 106 initiates a read voltage update operation 128 to generate one or more second read voltages based on the hard bit data and the soft bit data. A curve fitting operation may be performed to determine the second read voltage as described with respect to FIG. 2. The second read voltage may be used by the memory 104 to perform subsequent read(s) of the upper page 126 by comparing the cell threshold voltages to the second read voltage.

As a result of updating read voltages by reading a single bit from each storage element in a portion of a flash memory (e.g., reading a single page) rather than updating the read thresholds of all pages of the flash memory concurrently, latency may be improved by reducing sensing time and by reducing transfer time to collect and process read data. For example, less data will travel over the bus 150 when a single page is read as compared to when multiple pages are read concurrently.

Figure 2:
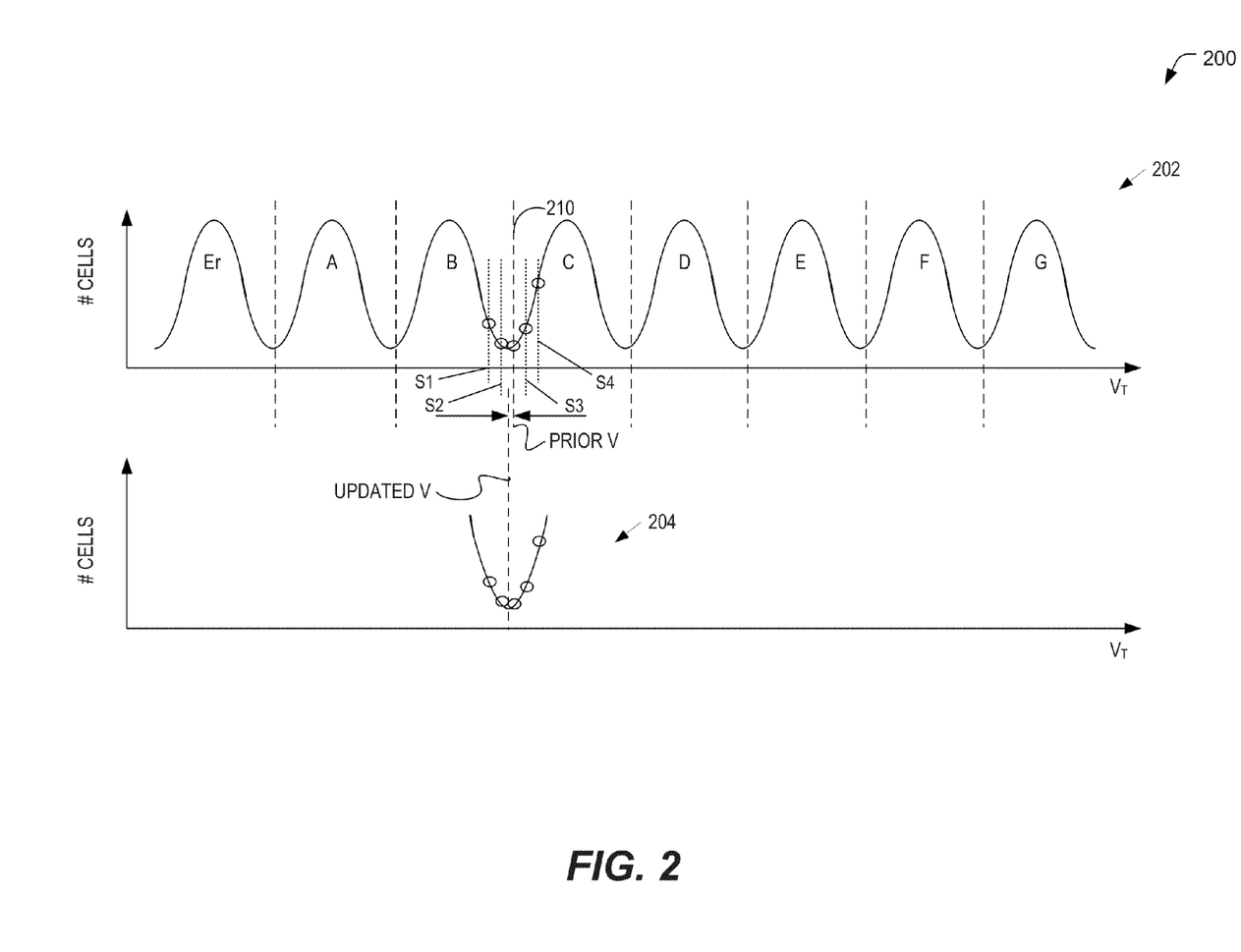
FIG. 2 is diagram of a particular embodiment of a sensing scheme and includes a graphical depiction of a cell voltage distribution for states (Er, A, . . . G) of a storage element of a memory where hard bit thresholds are offset from borders between state voltage ranges.

FIG. 2 shows an embodiment 200 of a sensing scheme and includes a graphical depiction 202 of a cell voltage distribution (CVD) for states (Er, A, ... G) of a storage element of a memory and threshold read voltages for hard bits and for soft bits. The hard bits indicate which state (Er-G) the threshold voltage is in, and the soft bits indicate whether the threshold voltage is within a center of the state's voltage range or near an edge of the state's voltage range. An illustrative hard bit threshold (also referred to as read voltage) 210 is shown between state B and state C, along with illustrative soft bit thresholds S1, S2, S3, and S4. A particular storage element may have a threshold voltage corresponding to a state that indicates data stored at the particular storage element. The data stored at the storage element may be read by comparing the threshold voltage to the threshold read voltages for hard bits to generate hard bits and to the threshold read voltages for soft bits to generate soft bits.

As illustrated in FIG. 2, a cell voltage distribution is shown where the hard bit thresholds are offset from borders between state voltage ranges. For example, a particular page, such as the upper page 126, may be read by comparing cell threshold voltages to one or more particular hard bit thresholds, such as hard bit threshold 210, and an uncorrectable error may be detected via an error correction coding operation. Hard bit data based on the data read using the hard bit threshold 210 may be generated. Subsequent reads may be performed using soft bit thresholds defining voltage sub-regions around the hard bit threshold 210. For example, subsequent reads may be performed at a soft bit threshold S1, at a soft bit threshold S2, at a soft bit threshold S3, and at a soft bit threshold S4. Soft bit data corresponding at least in part to the number of cells of the portion 110 at the memory 104 having a threshold voltage within a particular voltage threshold range may be provided to the controller 106. A determination may be made at the controller 106 as to how many cells of the portion 110 at the memory 104 have a threshold voltage within a threshold voltage range between S1 and S2, how many cells of the portion 110 at the memory 104 have a threshold voltage within a threshold voltage range between S2 and the hard bit threshold 210, how many cells of the portion 110 at the memory 104 have a threshold voltage within a threshold voltage range between the hard bit threshold 210 and S3, and how many cells of the portion 110 at the memory 104 have a threshold voltage within a threshold voltage range between S3 and S4. An updated hard bit threshold ("updated V") may be determined based on the hard bit data and the soft bit data corresponding to the particular page.

A curve fitting operation may be performed to determine the updated hard bit threshold. For example, as illustrated in FIG. 2, the soft bit data and the hard bit data corresponding to the boundary between states B and C may be fit to a parabolic curve 204 or other shape corresponding to a portion of a cell voltage distribution in the region of the boundary between states B and C. As an illustrative example, the curve fitting operation may be performed using a least squares data modeling technique. A minimum of the curve 204 may be determined and used as the updated hard bit threshold. To illustrate, the minimum of the curve 204 may define a border between states B and C and may be indicative of reduced errors due to shifting cell states.

In some embodiments, a single updated hard bit threshold may be sufficient for a single page. In other embodiments, one or more other boundaries or updated hard bit thresholds (e.g., F-G border and B-C border) may define the upper page as illustrated in FIG. 3.

A cell voltage distribution (CVD) of memory devices changes over time depending on various parameters including a time elapsed since program, temperature, geometry (e.g., die/block/word line) and a number of program and erase cycles, as illustrative examples. Consequently, voltage thresholds for hard bits and/or soft bits also vary. As a result, in order to maintain reliability and performance of memory systems, it is beneficial for memory controllers to timely update the voltage thresholds for the memory devices.

In contrast to the system of FIG. 1, read thresholds of other systems are typically updated for all pages of a flash memory concurrently. For example, a controller may collect the CVD for all of the pages of a flash memory and determine updated or new thresholds for all of the pages of the flash memory at the same time. To illustrate, in a three bit per cell memory device, there may be up to eight states (e.g., $2^3=8$) and seven state boundaries. If there is one hard bit threshold and four soft bit thresholds per state boundary, then the controller typically collects the CVD for all of the pages (e.g., a lower page, a middle page, and an upper page) by using thirty-five thresholds to obtain a histogram of the CVD. Six bits per cell would be used to build a histogram for the thirty-five sensing operations (e.g., one sensing operation per hard bit and soft bit threshold). In the system of FIG. 1, fewer sensing operations (e.g., 5, 10, or 15) may be performed and 3-4 bits per cell may be used to build a histogram for a single page.

Figure 3:
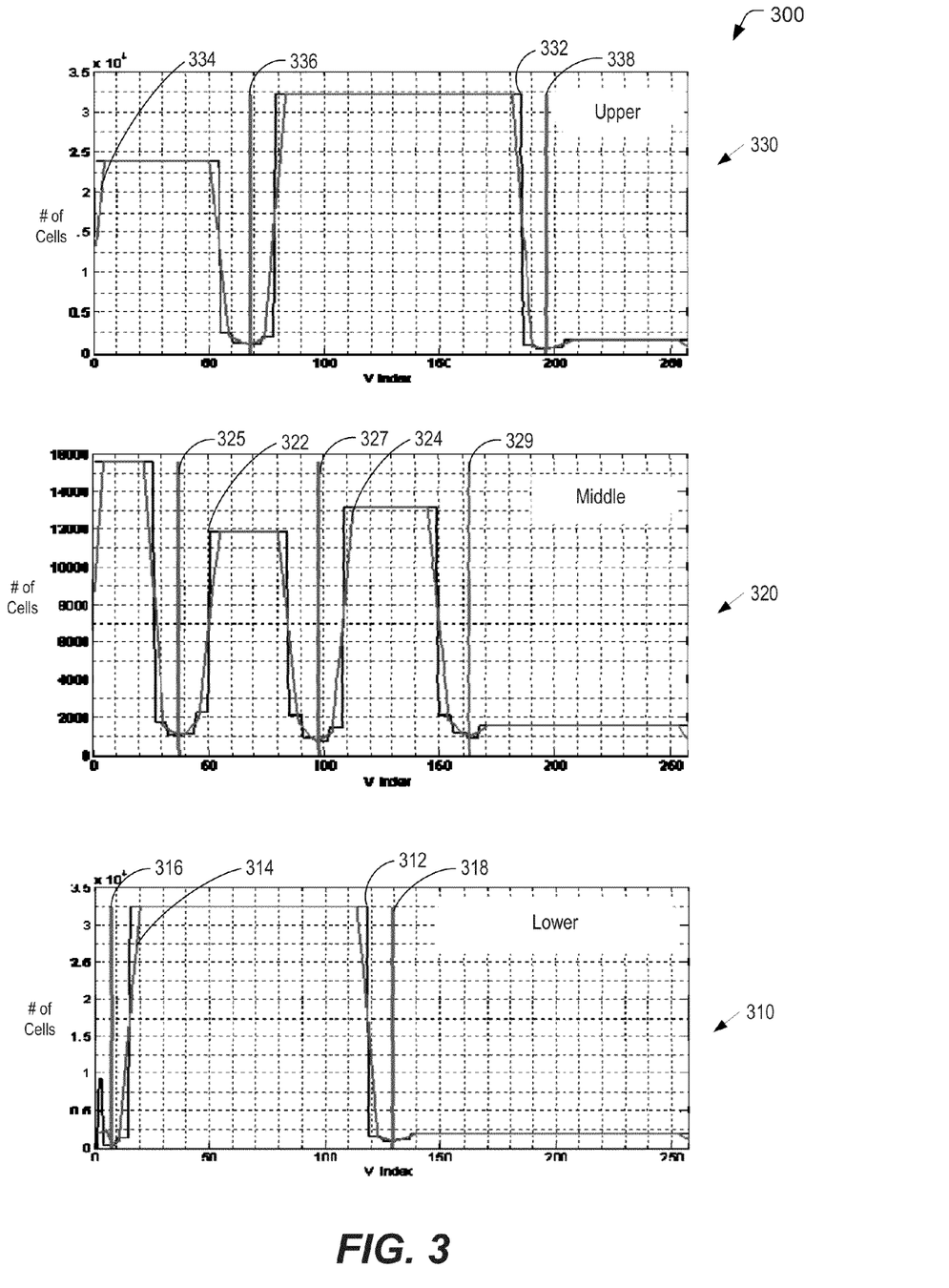
FIG. 3 is a diagram that illustrates a particular embodiment of histograms of representative lower, middle, and upper pages in a three bit per storage element memory device where the read thresholds of a particular page that is being accessed are updated by reading a single bit from each storage element in a portion of a memory.

Referring to FIG. 3, a diagram 300 illustrates histograms of representative lower, middle, and upper pages in a three bit per cell (3-BPC) memory device where the read thresholds of a particular page that is being accessed are updated by reading a single bit from each storage element in a portion of a memory. As illustrated, a histogram 310 of a lower page of a 3-BPC memory device includes a first curve 312 based on ten sensing operations (e.g., one hard bit threshold and four soft bit thresholds for each of two hard bit boundaries, such as the Er-A and D-E boundaries of FIG. 2). A second curve 314 represents an intermediate step to obtain new thresholds. For example, a curve fitting operation using the second curve 314 may be performed to obtain the new thresholds. Lines 316 and 318 represent new hard bit thresholds for the lower page.

A histogram 320 of a middle page of a 3-BPC memory device includes a first curve 322 based on fifteen sensing operations (e.g., one hard bit threshold and four soft bit thresholds for each of three hard bit boundaries, such as the A-B, C-D, and E-F boundaries of FIG. 2). A second curve 324 represents an intermediate step to obtain new thresholds. For example, a curve fitting operation may be performed to obtain the new thresholds using the second curve 324. Lines 325, 327, and 329 represent new hard bit thresholds for the middle page.

Similarly, a histogram 330 of an upper page of a 3-BPC memory device includes a first curve 332 based on ten sensing operations (e.g., one hard bit threshold and four soft bit thresholds for each of two hard bit boundaries, such as the B-C and F-G boundaries of FIG. 2). A second curve 334 represents an intermediate step to obtain new thresholds. For example, a curve fitting operation may be performed to obtain the new thresholds using the second curve 334. Lines 336 and 338 represent new hard bit thresholds for the middle page.

By reading a single bit from each storage element in a portion of a memory (e.g., to read a single page) rather than reading multiple pages concurrently, a number of sensing operations may be reduced (e.g., ten or fifteen sensing operations rather than thirty-five), improving latency by reducing sensing time.

Figure 4:
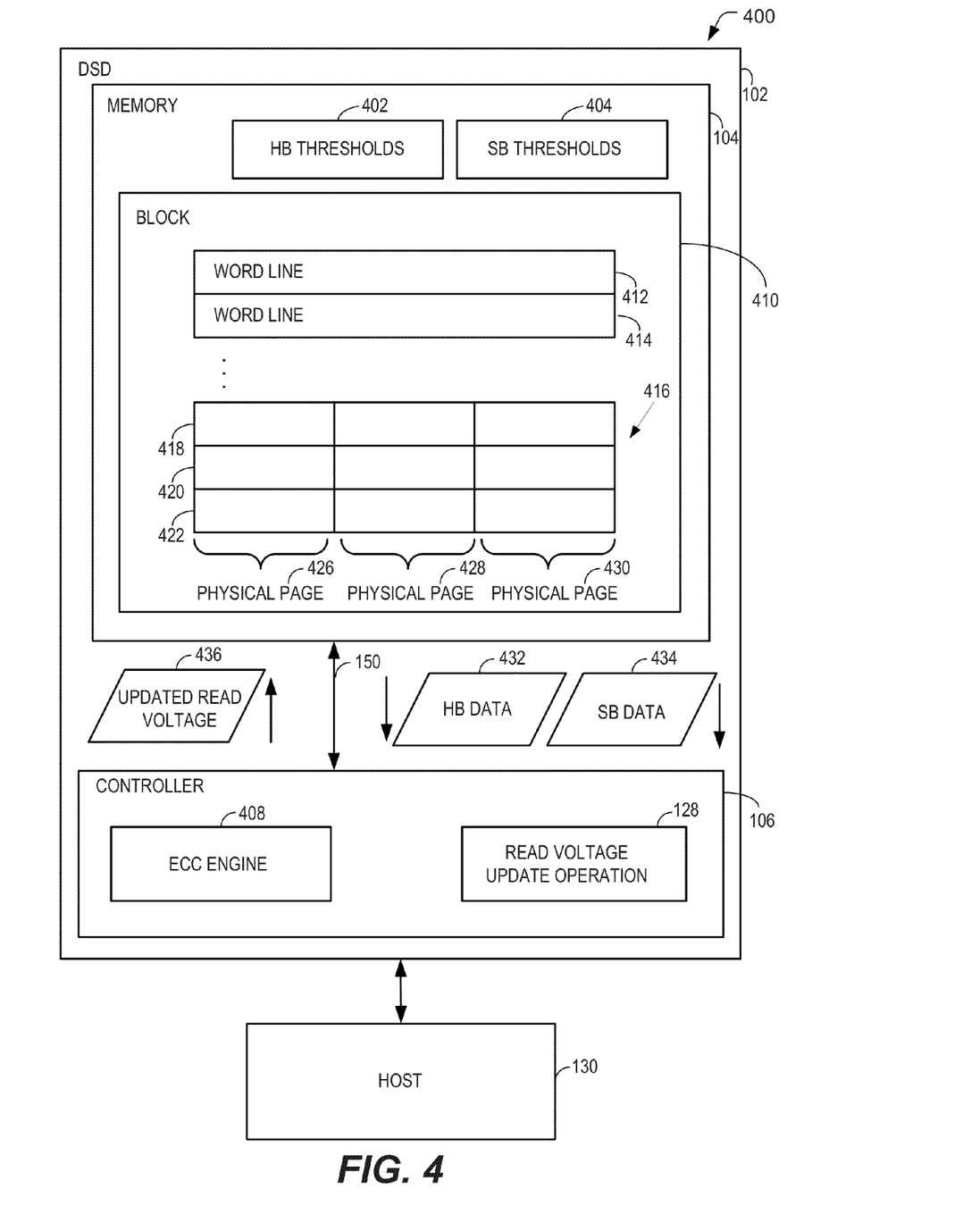
FIG. 4 is a block diagram of a second illustrative embodiment of a system to update read voltages by reading a single bit from each storage element in a portion of a memory.

Referring to FIG. 4, a particular illustrative embodiment of a system of updating read voltages by reading a single bit from each storage element in a portion of a memory is depicted and generally designated 400. The system 400 includes the data storage device 102 coupled to the host device 130. The data storage device 102 includes the memory 104 coupled to the controller 106 via the bus 150.

The memory 104 includes a hard bits threshold 402 and a soft bits threshold 404. The hard bits threshold 402 may include threshold read voltages for hard bits (e.g., the hard bit threshold 210 in FIG. 2) and the soft bits threshold 404 may include threshold read voltages for soft bits (e.g., S1, S2, S3, and S4 in FIG. 2). A soft bit can be used by a decoder within an error correction coding (ECC) engine 408 in conjunction with one or more hard bits to enhance a reading operation by indicating a relative reliability of the hard bits read from the memory 104.

The memory 104 may also include multiple blocks, such as a representative block 410. Each block may be an erase block of a NAND flash memory. Each block may include one or more word lines, such as representative word lines 412, 414, and 416. Each word line may include one or more pages. For example, the word line 416 may include an upper page 418, a middle page 420, and a lower page 422 corresponding to bits stored in storage elements of a physical page 426. Each word line may include multiple physical pages, such as the representative physical pages 426, 428, and 430. Each physical page may include an upper page, a middle page, and a lower page. Each page 418-422 may represent a smallest writable unit of data to the memory 104.

The controller 106 includes the ECC engine 408 and may execute a read voltage update operation 128. The ECC engine 408 may be configured to detect errors in the read data corresponding to the storage elements 112 of FIG. 1. The controller 106 may be configured to receive memory access requests from the host device 130 and to process data read from the memory 104. The controller 106 may be configured to receive hard bit data 432 and soft bit data 434 from the memory 104. For example, an uncorrectable error may occur when reading one of the upper, middle, and lower pages (e.g., pages 418-422, respectively) using a first read voltage. In response to the uncorrectable error, the controller 106 may be configured to initiate the read voltage update operation 128 to generate one or more updated read voltages 436 based on the hard bit data 432 and the soft bit data 434. For example, the controller 106 may be configured to read a single bit from each storage element (e.g., the bits in the upper page 418) using the updated read voltage 436. To illustrate, the curve fitting operation described with respect to FIG. 2 may be performed to determine the updated read voltage 436. The updated read voltage 436 may be sent by the controller 106 to the memory 104 via the bus 150 and used by the memory 104 to perform a subsequent read of the upper page 418 by comparing the hard bit threshold voltages 404 of the upper page 418 to the updated read voltage 436. A subsequent ECC operation may be performed on the data by the controller 106 via the ECC engine 408.

By reading a single bit from each storage element (e.g., a single logical page) in a portion of a memory rather than reading multiple pages concurrently, latency may be improved by reducing sensing time in the memory 104 and by reducing transfer time of the bus 150 to collect and process read data.

Figure 5:
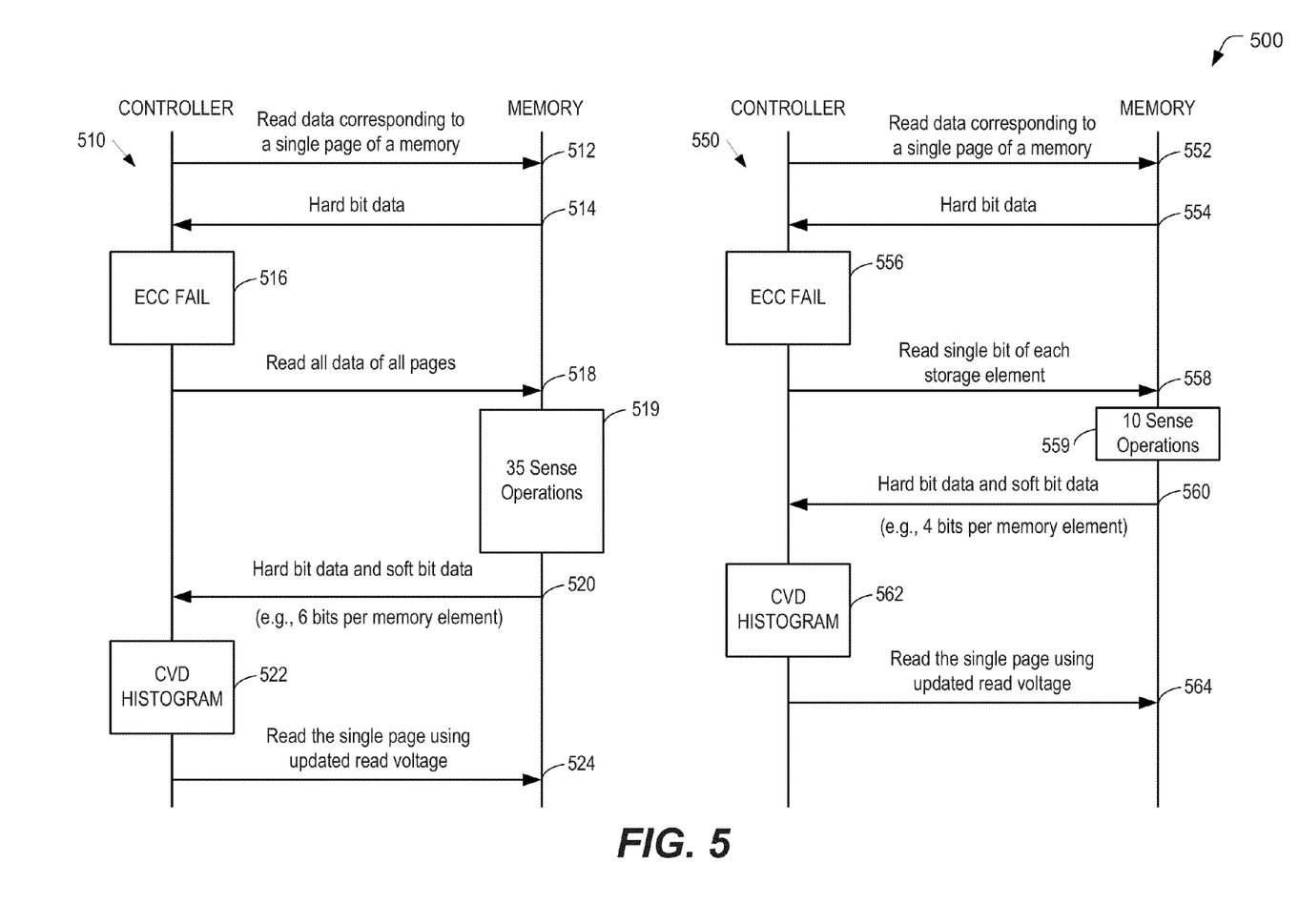
FIG. 5 is a diagram that illustrates a comparison between updating read thresholds for all pages of a portion of a flash memory concurrently and updating the read thresholds of a particular page that is being accessed by reading a single bit from each storage element in the portion of the flash memory.

Referring to FIG. 5, a diagram 500 is depicted that illustrates a comparison between a first sequence diagram 510 that illustrates updating read thresholds for all pages of a flash memory concurrently and a second sequence diagram 550 that illustrates updating the read thresholds of a particular page that is being accessed by reading a single bit from each storage element in a portion of a memory.

The sequence diagram 510 illustrates updating read thresholds for all pages of a flash memory concurrently and shows messaging between a controller and a memory, such as the controller 106 and the memory 104 of FIG. 1. The sequence diagram 510 includes sending a command to read data corresponding to a single page of a memory, at 512. For example, data corresponding to the upper page 126 may be read from the memory 104 using a first read voltage. Hard bit data based on the data read using the first read voltage may be received by the controller 106 from the memory 104, at 514. For example, a bit value (e.g., "1 1 0 1") corresponding to a determined state of the upper page 126 of each of the storage elements 113, 115, 117, and 119, respectively, may be provided to the controller 106. Although a four-bit value is provided for clarity, it should be understood that each page may include several hundred to several thousand bits, or more, depending on a particular implementation. The hard bit data may be provided to an error-correction-coding (ECC) operation, at 516. For example, the controller 106 may be configured to provide the hard bit data to an ECC engine, such as the ECC engine 408 of FIG. 4.

In response to the ECC operation indicating that the hard bit values are uncorrectable by the ECC operation, the controller 106 may perform a read voltage update operation. For example, a command may be sent to read data from all pages of the memory concurrently, at 518. To illustrate, the read thresholds of all pages of the memory 104 (e.g., representative pages 122-126) may be read concurrently via thirty-five sense operations, at 519. Hard bit data and soft bit data based on the concurrent read of all pages of the memory 104 may be provided to the controller by the memory, at 520. For example, where the memory is a 3-BPC multi-level-cell (MLC) memory, the hard bit data and the soft bit data may include six bit values for each MLC cell.

A curve fitting operation may be performed based on cell voltage distribution (CVD) histograms, at 522. For example, a CVD histogram based on the hard bit data and the soft bit data for all the pages of the memory may be determined and updated read voltage thresholds based on the CVD histogram may be determined for all pages of the memory (i.e., for all boundaries between cell states). After the updated read voltage thresholds have been determined, a command may be sent for data corresponding to the single page (e.g., the upper page 126) to be read from the memory 104 using the updated read voltage, at 524.

The sequence diagram 550 illustrates updating the read thresholds of a particular page that is being accessed by reading a single bit from each storage element in a portion of a memory and shows messaging between a controller, such as the controller 106, and a memory, such as the memory 104. The sequence diagram 550 illustrates updating only the read thresholds corresponding to the particular page that is being accessed rather than updating the read thresholds of all pages stored in the cells being accessed. To illustrate, data corresponding to a single page of the memory 104 may be read, at 552. For example, a command to read data corresponding to the upper page 126 using a first read voltage may be sent to the memory 104. Hard bit data corresponding to the data read using the first read voltage may be received by the controller 106 from the memory 104, at 554. For example, a bit value (e.g., "1 1 0 1") corresponding to a determined state of the upper page 126 of each of the storage elements 113, 115, 117, and 119, respectively, may be provided to the controller 106. An error correction code procedure may be performed on the hard bit data, at 556.

In response to the ECC procedure indicating that the hard bit data is uncorrectable, a read threshold update operation may be performed. For example, an uncorrectable error may occur when reading the data corresponding to the upper page 126 at the first read voltage. Rather than updating the read thresholds of all pages of the memory 104 (e.g. the upper, middle, and lower pages 122, 124, and 126, respectively) concurrently, the controller 106 is configured to update the read threshold(s) of the particular page being accessed. For example, the controller 106 sends a command to read a single bit from each storage element based on the first read voltage, at 558. The single bit may be read from each storage element in a single physical page of the memory 104, from each storage element in a word line of the memory 104, or from each storage element in a block of the memory 104. To illustrate, the read threshold update operation may be performed by reading the upper page of a particular physical page of the memory 104, by reading the upper page of a word line of the memory 104, or by reading the upper page of a block of the memory 104. As an example, when the single bit corresponds to the upper page (e.g., histogram 330 of FIG. 3), ten sensing operations may be performed, at 559.

Hard bit data and soft bit data may be generated by the memory 104 based on the data read at the first read voltage and received by the controller, at 560. For example, hard bit data and soft bit data may be generated based on data corresponding to the upper page of a particular logical page of the memory 104, data corresponding to the upper page of a word line of the memory 104, or data corresponding to the upper page of a block of the memory 104. In the embodiment of FIG. 3, four bits may be transferred for every MLC cell for the upper, middle, or lower page. The controller 106 may be configured to perform a curve fitting operation based on CVD histograms to determine an updated hard bit threshold, at 562. For example, a CVD histogram based on the hard bit data and the soft bit data for the single bits read may be determined and updated read voltage thresholds based on the CVD histogram may be determined for the particular page accessed. After the updated read voltage thresholds have been determined, a command to read data corresponding to the particular page accessed using the updated read voltage may be sent to the memory 104, at 564. Data may be read from the memory 104 in a subsequent data read using the updated read voltage, which may reduce a number of data errors resulting from sensed programming states that do not match written programming states.

Figure 6:
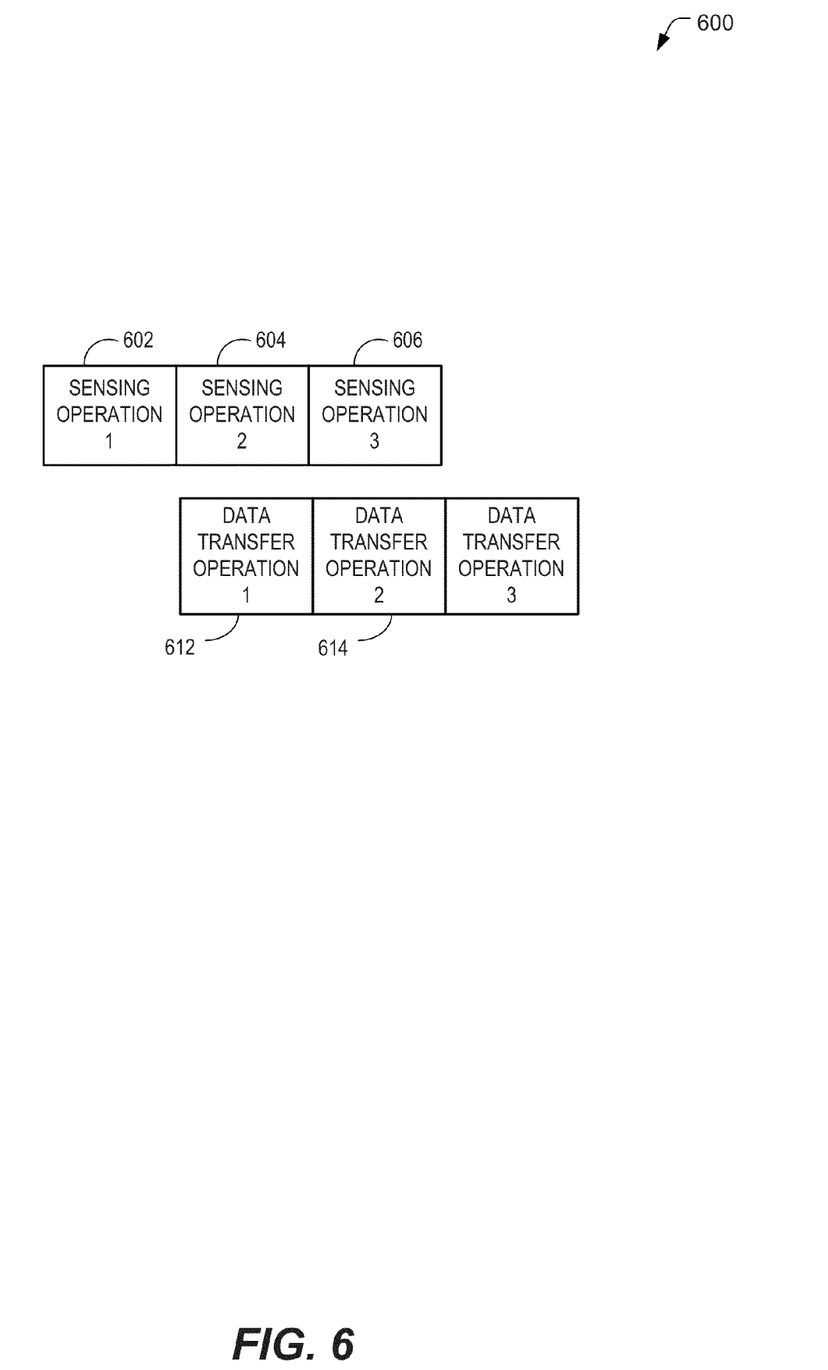
FIG. 6 is a diagram illustrating an example of pipeline processing when updating read voltages by reading a single bit from each storage element in a portion of a memory.

FIG. 6 illustrates an example of use of pipeline processing 600 when updating read voltages by reading a single bit from each storage element in a portion of a memory. For example, an error correction coding (ECC) procedure may indicate that hard bit data received based on reading data corresponding to a page of a memory using a first read voltage is uncorrectable. In response to the ECC procedure indicating an uncorrectable error, a first sensing operation is performed, at 602. For example, the controller 106 may read a first page by reading data corresponding to a single bit from each storage element based on the first read voltage.

A first data transfer operation is shown, at 612. For example, hard bit data and soft bit data may be generated by the memory 104 based on the data read using the first read voltage and may be received by the controller 106 from the memory 104. To illustrate, hard bit data and soft bit data may be generated based on data corresponding to the upper page of a particular logical page of the memory 104. The controller 106 may perform the read voltage update operation to determine an updated read voltage threshold (e.g., updated hard bit data).

A second sensing operation is performed, at 604. For example, after the updated read voltage threshold has been determined, the controller 106 may instruct the memory 104 to read a second page from the same portion of the memory 104 by reading data corresponding to another single bit from each storage element while the first data transfer operation 612 is ongoing, thereby enabling pipelined processing. A third page may be read from the same portion of the memory 104 by reading data corresponding to another single bit from each storage element in a third sensing operation 606 while a second data transfer operation 614 is being performed.

By enabling pipelined processing, an overall latency may be reduced when sequentially reading each logical page of a memory portion and updating read voltages on a page-by-page basis, as compared to non-pipelined operation.

Figure 7:
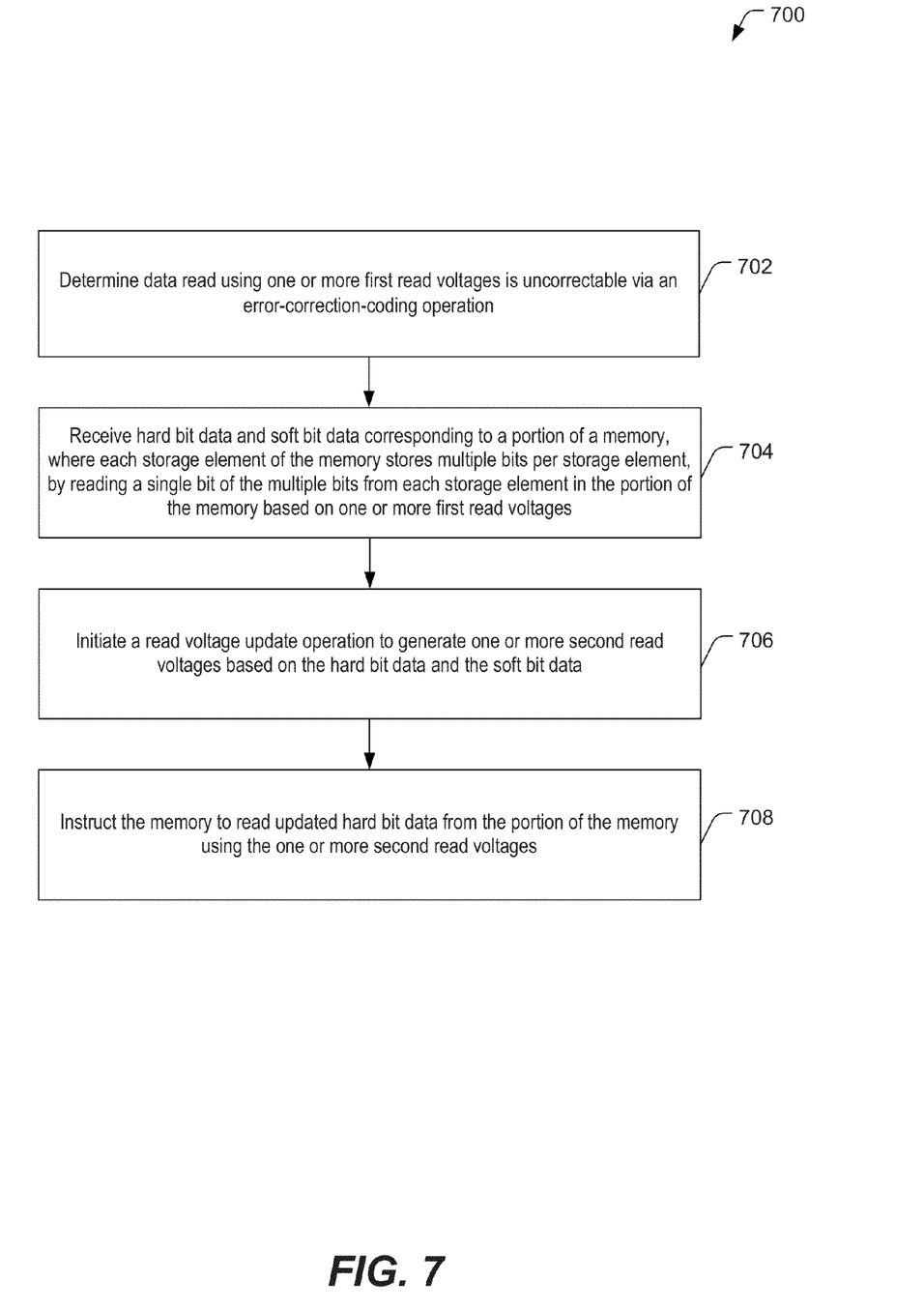
FIG. 7 is a flow diagram illustrating a particular embodiment of a method of updating read voltages by reading a single bit from each storage element in a portion of a memory.

Referring to FIG. 7, a flow diagram illustrating a particular embodiment of a method of updating read voltages by reading a single bit from each storage element in a portion of a memory is depicted and generally designated 700. The method 700 may be performed in a controller of a data storage device. For example, the method may be performed in the controller 106 of the data storage device 102 of FIG. 1.

A determination is made that data read using one or more first read voltages is uncorrectable via an error-correction-coding operation, at 702. Data of a single logical page read using the one or more first read voltages may be uncorrectable via an error correction coding (ECC) operation. For example, an uncorrectable error may be detected when reading data corresponding to the upper page 126 by comparing voltages of the storage elements 113-119 to a first read voltage.

Hard bit data and soft bit data corresponding to a portion of a memory is received, where each storage element of the memory stores multiple bits per storage element, in connection with reading a single bit of the multiple bits from each storage element in the portion of the memory based on one or more first read voltages, at 704. As an example, the portion of the memory 104 may be a physical page, a word line, or a block. To illustrate, each storage element 113-119 in the memory 104 may store multiple bits per storage element. The controller 106 may read a single bit from each storage element based on the first read voltage. For example, the single bit may be read from each storage element in a single logical page of the memory 104, from each storage element 113-119 in a word line of the memory 104, such as the word line 121, or from each storage element in a block of the memory 104. Hard bit data and soft bit data may be generated by the memory 104 and received by the controller 106 based on the data read at the first read voltage.

A read voltage update operation may be initiated to generate one or more second read voltages based on the hard bit data and the soft bit data, at 706. For example, the read threshold update operation may be performed by reading the upper page of a particular logical page of the memory 104, by reading the upper page of a word line of the memory 104, or by reading the upper page of a block of the memory 104. The curve fitting operation described with respect to FIG. 2 may be performed to determine an updated hard bit threshold (e.g., to generate one or more second read voltages).

The memory may be instructed to read updated hard bit data from the portion of the memory using the one or more second read voltages, at 708. In an illustrative embodiment, the updated hard bit data may correspond to a single logical page of the portion of the memory 104. For example, the second read voltages may be sent by the controller 106 to the memory 104 and used by the memory 104 to perform a subsequent read of the upper page 126 by comparing the hard bit threshold voltages of the upper page to the second read voltages. A subsequent ECC operation may be performed on the subsequently read data by the controller 106.

By reading a single bit from each storage element in a portion of a memory rather than reading multiple pages concurrently, latency may be improved by reducing sensing time and by reducing an amount of data transferred between the memory 104 and the controller 106 when read voltages are updated in response to an ECC error.

Although various components depicted herein are illustrated as block components and described in general terms, such components may include one or more microprocessors, state machines, or other circuits configured to enable a data storage device, such as the data storage device 102 of FIG. 1 and FIG. 4, to perform the particular functions attributed to such components, or any combination thereof. For example, the controller 106 of FIG. 1 and FIG. 2 may represent physical components, such as controllers, processors, state machines, logic circuits, or other structures to cause the read voltage update operation 128 to generate one or more second read voltages.

The controller 106 may be implemented using a microprocessor or microcontroller programmed to generate control information and to initiate and perform the read voltage update operation 128. In a particular embodiment, the controller 106 includes a processor executing instructions that are stored at the memory 104. Alternatively, or in addition, executable instructions that are executed by the processor may be stored at a separate memory location that is not part of the memory 104, such as at a read-only memory (ROM).

In a particular embodiment, the data storage device 102 may be a portable device configured to be selectively coupled to one or more external devices. For example, the data storage device 102 may be a removable device such as a universal serial bus (USB) flash drive or removable memory card. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a controller of a data storage device, wherein the data storage device includes a memory and wherein each storage element of the memory stores multiple bits per storage element, performing:
   updating a first read voltage corresponding to a single bit of the multiple bits without updating other read voltages corresponding to the other bits of the multiple bits by:
   receiving hard bit data and soft bit data corresponding to a portion of the memory in connection with reading the single bit of the multiple bits from each storage element in the portion of the memory based on the first read voltage; and
   initiating a read voltage update operation based on the single bit to generate a second read voltage based on the hard bit data and the soft bit data; and
   instructing the memory to read data from the portion of the memory using the second read voltage.

2. The method of claim 1, wherein updated hard bit data is received in connection with reading the data using the second read voltage and wherein the updated hard bit data corresponds to a single logical page of the memory.

3. The method of claim 2, wherein each storage element of the memory stores three bits per storage element and wherein the single logical page is read using multiple read voltages that correspond to hard bit boundaries.

4. The method of claim 1, wherein the portion of the memory is a page.

5. The method of claim 4, wherein the page is a physical page.

6. The method of claim 1, wherein the portion of the memory is a word line.

7. The method of claim 1, wherein the portion of the memory is a block.

8. The method of claim 1, wherein the read voltage update operation includes determining a cell-voltage-distribution (CVD) histogram based on the hard bit data and the soft bit data.

9. The method of claim 1, wherein the hard bit data and the soft bit data is received while instructing the memory to read the updated hard bit data using the second read voltage.

10. A data storage device comprising:
    a memory, wherein each storage element of the memory stores multiple bits per storage element; and
    a controller configured to update a first read voltage corresponding to a single bit per storage element of the multiple bits per storage element without updating other read voltages corresponding to the other bits of the multiple bits per storage element, the controller configured to:
    receive hard bit data and soft bit data corresponding to a portion of the memory by causing the memory to read the single bit of the multiple bits from each cell in the portion of the memory based on the first read voltage;
    initiate a read voltage update operation based on the single bit to generate a second read voltage based on the hard bit data and the soft bit data; and
    instruct the memory to read data from the portion of the memory using the second read voltage.

11. The data storage device of claim 10, wherein updated hard bit data is received in connection with reading the data using the second read voltage and wherein the updated hard bit data corresponds to a single logical page of the memory.

12. The data storage device of claim 11, wherein each storage element of the memory stores three bits per storage element and wherein the single logical page is read using multiple read voltages that correspond to hard bit boundaries.

13. The data storage device of claim 10, wherein the portion of the memory is a page.

14. The data storage device of claim 13, wherein the page is a physical page.

15. The data storage device of claim 10, wherein the portion of the memory is a word line.

16. The data storage device of claim 10, wherein the portion of the memory is a block.

17. The data storage device of claim 10, wherein the read voltage update operation includes determining a cell-voltage-distribution (CVD) histogram based on the hard bit data and the soft bit data.

18. The data storage device of claim 10, wherein the hard bit data and the soft bit data is received while instructing the memory to read the data using the second read voltage.

* * * * *